(12) United States Patent
Omoto

(10) Patent No.: US 11,043,353 B2
(45) Date of Patent: Jun. 22, 2021

(54) ENERGY FILTER AND CHARGED PARTICLE BEAM APPARATUS

(71) Applicant: JEOL Ltd., Tokyo (JP)

(72) Inventor: Kazuya Omoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/827,156

(22) Filed: Mar. 23, 2020

(65) Prior Publication Data

US 2020/0321185 A1 Oct. 8, 2020

(30) Foreign Application Priority Data

Apr. 8, 2019 (JP) .............................. JP2019-073666

(51) Int. Cl.
*H01J 37/05* (2006.01)

(52) U.S. Cl.
CPC ......... *H01J 37/05* (2013.01); *H01J 2237/057* (2013.01)

(58) Field of Classification Search
CPC ...... H01J 37/05; H01J 2237/057; H01J 49/46; H01J 37/295; H01J 37/28; H01J 2237/2802; H01J 2237/24485; H01J 2237/055
USPC ....................................................... 250/305
See application file for complete search history.

(56) References Cited

U.S. PATENT DOCUMENTS

| | | | | |
|---|---|---|---|---|
| 5,177,361 A * | 1/1993 | Krahl | ...... | H01J 37/05 250/298 |
| 5,448,063 A * | 9/1995 | De Jong | ...... | H01J 37/05 250/305 |
| 5,449,914 A * | 9/1995 | Rose | ...... | H01J 37/05 250/305 |
| 6,384,412 B1 * | 5/2002 | Krahl | ...... | H01J 37/05 250/305 |
| 6,770,878 B2 * | 8/2004 | Uhlemann | ...... | H01J 37/05 250/305 |
| 2002/0033455 A1 | 3/2002 | Rose | | |
| 2018/0301314 A1* | 10/2018 | Omoto | ...... | H01J 37/28 |

FOREIGN PATENT DOCUMENTS

| | | |
|---|---|---|
| JP | H737536 A | 2/1995 |
| JP | 200030645 A | 1/2000 |
| JP | 2001243910 A | 9/2001 |
| JP | 2018129171 A | 8/2018 |

* cited by examiner

*Primary Examiner* — Michael Maskell
(74) *Attorney, Agent, or Firm* — The Webb Law Firm

(57) ABSTRACT

An energy filter has a plurality of sector magnets which are configured symmetrically with respect to a symmetry plane, and forms a real image on the symmetry plane. The energy filter include: an entrance aperture provided with a slit having a longitudinal direction in a direction perpendicular to an energy dispersion direction; and a hexapole and a quadrupole disposed on the symmetry plane.

6 Claims, 14 Drawing Sheets for $s^2 = \gamma^2 + \delta^2$

ENERGY FILTER AND CHARGED PARTICLE BEAM APPARATUS

CROSS-REFERENCE TO RELATED APPLICATION

This application claims priority to Japanese Patent Application No. 2019-073666 filed Apr. 8, 2019, the disclosure of which is hereby incorporated by reference in its entirety.

BACKGROUND OF THE INVENTION

Field of the Invention

The present invention relates to an energy filter and a charged particle beam apparatus.

Description of Related Art

Electron energy loss spectroscopy (EELS) is an analytical technique of irradiating a sample with an electron beam, and acquiring a spectrum that represents the loss energy level of electrons transmitted through the sample. The energy that an electron loses within the sample depends on the elements constituting the sample and on how atoms are mutually bonded. Therefore by examining the spectrum, it is possible to know the types of elements contained in the sample, and how the elements are bonded.

The principle functions of an energy filter in transmission electron microscopy (TEM) are spectroscopy and imaging.

In the spectroscopy mode, an energy spectrum can be acquired by focusing the energy dispersive plane of the energy filter on a screen. In particular, a technique of combining the transmission electron microscopy and an energy filter is referred to as TEM-EELS, and a technique of combining scanning transmission electron microscopy (STEM) and an energy filter is referred to as STEM-EELS. In the scanning transmission electron microscopy, atomic resolution can be acquired more easily than in the transmission electron microscopy. Therefore in recent years, an elemental distribution observing method having atomic resolution using the scanning transmission electron microscopy has attracted attention.

In the imaging mode, a TEM image can be acquired by focusing an achromatic plane of the energy filter on the screen. Furthermore, a TEM image, corresponding to a certain loss energy level of electrons, can be acquired by placing an energy selecting slot on the energy dispersive plane, and selecting only the electrons having a certain loss energy level. In addition, a distribution image of an element can be acquired by selecting the loss energy level intrinsic to the element. This technique is referred to as the energy filtering TEM (EF-TEM).

Energy filters are classified into an in-column type and a post-column type. In the in-column type, an energy filter is disposed between the intermediate lens and the projection lens of a transmission electron microscope. On the other hand, in the post-column type, an energy filter is disposed behind the projection lens (e.g. under a lens barrel).

An advantage of the in-column type is that it is not necessary to correct some of the aberrations that are generated from the energy filter itself, since these aberrations are cancelled out by the structural symmetry of the energy filter. Another advantage is that an image observation mode and a spectrum observation mode can easily be switched by the projection lens. A further advantage is that observation in a wide field of view, from low magnification to high magnification, can be supported because filtering is performed by the energy filter prior to magnification by the projection lens. A disadvantage of the in-column type is that the height of the apparatus (lens barrel) is increased because the energy filter is disposed between the intermediate lens and the projection lens, and this may lead to a deterioration of earthquake resistance and a drop in apparatus performance due to vibrations. Another disadvantage is that it is not easy to post-install the filter in a general purpose transmission electron microscope in an attempt to expand functionality.

An advantage of the post-column type is that it can be easily post-installed into a general purpose transmission electron microscope, and at this time, it is not necessary to change the height of the apparatus. A disadvantage of the post-column type is that many component parts are needed to correct aberrations, and adjusting the axis is not easy. Further, cost is increased, and it is unsuitable for low-magnification observation because of the optical restrictions imposed when the energy filter is connected to a transmission electron microscope.

In the in-column type, it is difficult to add component parts to correct aberrations. This is because the space that accommodates these component parts to correct aberrations imposes restrictions on the design of the fundamental optical system. Aberration-correcting Ω filters having additional component parts to correct aberrations are disclosed in JP-A-2000-30645 and JP-A-7-37536.

Further, the in-column type has the problem where the height of the apparatus is increased, as mentioned above. On the other hand, JP-A-2001-243910 discloses a 180 inversion type aberration correcting Ω filter, in which an increase in the height of the apparatus is controlled by setting the sum of the deflection angles of the electron beams, which are deflected by the energy filter, to 180°.

Various types of in-column energy filters, such as α types, γ types and mandolin types are known, in addition to the Ω types. Furthermore, Ω type filters are classified into an A-type and B-type according to the optical system.

JP-A-2018-129171 discloses an in-column type energy filter which has a simple structure and can implement low aberration.

The optical system of the energy filter includes an entrance crossover plane S1, an entrance image plane A1, an exit crossover plane (energy dispersive plane) S2, and an exit image plane (achromatic plane) A2. The optical system of the energy filter is characterized by these four important planes.

In order to realize the performance of an energy filter, electrons must be entered such that a crossover is focused on the entrance crossover plane S1, and an image is focused on the entrance image plane A1. On the exit side of the energy filter, a plane where energy dispersion occurs (energy dispersive plane S2) is formed at a position to be mirror-symmetrical with the entrance crossover plane S1, and a plane where energy dispersion does not occur (achromatic plane A2) is formed at a position to be mirror-symmetrical with the entrance image plane A1. The energy resolution of an Ω filter is 1 μm/eV, for example, for an electron beam with an acceleration voltage of 200 kV.

FIG. 21 illustrates the relationship between the achromatic plane A of the energy filter and the energy dispersive plane S. The entrance crossover plane S1 and the energy dispersive plane S2 are mirror-symmetrical with respect to a symmetry plane, and are optically equivalent. Similarly, the entrance image plane A1 and the achromatic plane A2 are mirror-symmetrical with respect to a symmetry plane, and are optically equivalent. Therefore the entrance crossover plane S1 and the energy dispersive plane S2 are referred to as "energy dispersive plan S", unless a distinction is necessary. Similarly, the entrance image plane A1 and the achromatic plane A2 are referred to as achromatic plane A, unless a distinction is necessary.

When the distance L between the energy dispersive plane S and the achromatic plane A is large, angular apertures α and β can be made to be small, and this is advantageous in reducing the aberrations on the image plane. However, increasing the distance L does not proportionally improve performance for the following reason.

The aberration coefficient of the Ω filter is determined by determining the shape and arrangement of the magnets of the Ω filter with respect to a given distance L. However, the correlation of the shapes of the magnets, their arrangement and the aberration coefficient is complicated (the degree of complexity is in proportion to the number of magnets), and in many cases, the above mentioned advantages are cancelled out or a disproportionate increase in the aberration coefficients occurs.

If the apparatus is designed so that the aberrations on the image plane are small, the aberrations on the energy dispersive plane normally tend to deteriorate. The opposite is also true.

FIG. 22 is a diagram for describing geometric aberrations that are generated on the energy dispersive plane.

An aberration of the energy spectrum that is generated on the energy dispersive plane becomes triangular, as illustrated in FIG. 22, and increases in proportion to the square of the visual field size (angle of view γ and δ from one points on the energy dispersive plane to the image plane). The size of this shape becomes an index of the level of the energy resolution.

For example, the size of γδ is about 5 mrad, and the size of αβ is about 0.1 mrad. Here αβ is small, and the beam shape on the energy dispersive plane is handled as a point.

Some of the second order aberrations in the Ω filter are cancelled out by the symmetry, but the remaining aberrations appear distorted and blurred in both the energy dispersive plane S and the achromatic plane A. The above mentioned aberration correcting omega filter can cancel out these remaining aberrations. However, the structure of the aberration correcting Ω filter is complicated.

It is desirable that an energy filter has a simple structure, and can improve the energy resolution.

SUMMARY OF THE INVENTION

According to a first aspect of the invention, there is provided an energy filter that has a plurality of sector magnets which are configured symmetrically with respect to a symmetry plane, and forms a real image on the symmetry plane, the energy filter including:

an entrance aperture provided with a slit having a longitudinal direction in a direction perpendicular to an energy dispersion direction; and a hexapole and a quadrupole disposed on the symmetry plane.

According to a second aspect of the invention, there is provided a charged particle beam apparatus including the above energy filter.

DESCRIPTION ON THE INVENTION (1) According to an embodiment of the invention, there is provided an energy filter that has a plurality of sector magnets which are configured symmetrically with respect to a symmetry plane, and forms a real image on the symmetry plane, the energy filter including:

an entrance aperture provided with a slit having a longitudinal direction in a direction perpendicular to an energy dispersion direction; and a hexapole and a quadrupole disposed on the symmetry plane.

In the case of this energy filter, geometric aberrations of the energy spectrum can be corrected using the a hexapole and a quadrupole. Therefore this energy filter can improve the energy resolution with a simple structure.

(2) According to an embodiment of the invention, there is provided a charged particle beam apparatus including the above energy filter.

This charged particle beam apparatus, which includes the energy filter, can correct the geometric aberrations of the energy spectrum. Therefore this charged particle beam apparatus can improve the energy resolution with a simple configuration.

Preferred embodiments of the invention are described in detail below with reference to the drawings. Note that the following embodiments do not unduly limit the scope of the invention as stated in the claims. In addition, all of the elements described below are not necessarily essential requirements of the invention.

In the following description, an electron microscope for observing a sample by irradiating an electron beam is taken as an example of the charged particle beam apparatus according to the invention, but the charged particle beam apparatus according to the invention may be any apparatus for observing a sample by irradiating a charged particle beam (e.g. ions) other than an electron beam. Examples of the charged particle beam apparatus according to the invention include a transmission electron microscope (TEM), and a scanning transmission electron microscope (STEM).

1. First Embodiment 1.1 Energy Filter

Figure 1:
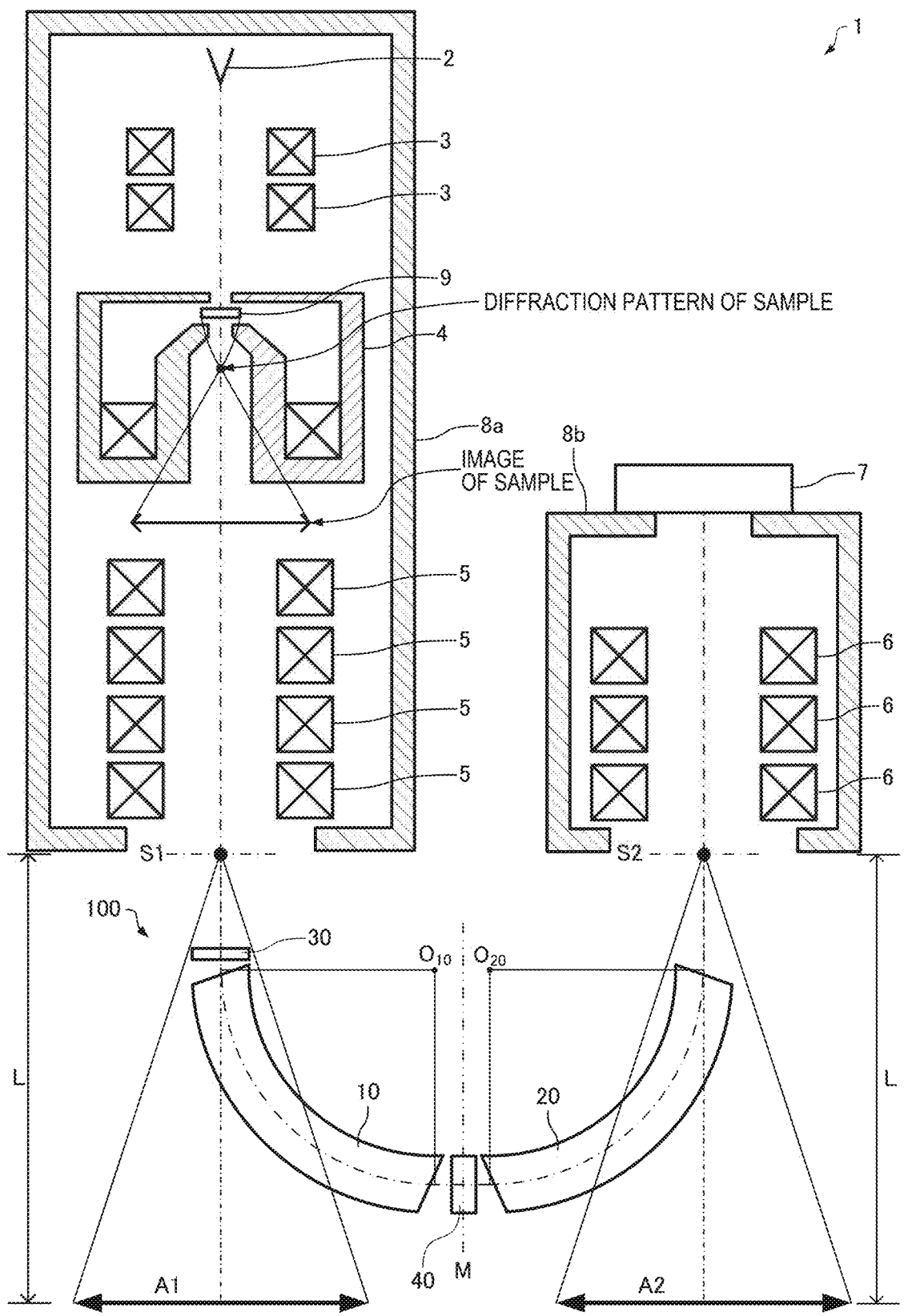
FIG. 1 is a diagram illustrating a configuration of an electron microscope equipped with an energy filter according to the first embodiment of the invention.

First, an energy filter according to the first embodiment will be described with reference to the drawings. FIG. 1 is a diagram illustrating a configuration of an electron microscope 1 equipped with the energy filter 100 according to the first embodiment. The electron microscope 1 is a transmission electron microscope.

As illustrated in FIG. 1, the electron microscope 1 includes an electron source 2, an illumination lens 3, an objective lens 4, an intermediate lens 5, the energy filter 100, a projection lens 6, and an imaging apparatus 7.

The electron source 2 generates electrons. For example, the electron source 2 is an electron gun in which electrons emitted from a cathode are accelerated by an anode such that an electron beam is emitted from the gun.

The illumination lens 3 focuses the electron beam emitted from the electron source 2 onto a sample 9. The illumination lens 3 is constituted of a plurality of electron lenses, for example.

The objective lens 4 is a lens in an initial stage of forming a transmission electron microscope (TEM) image using the electron beam transmitted through the sample 9. The objective lens 4 has pole pieces for applying a strong magnetic field to the sample 9, and which the sample 9 is placed between the pole pieces.

The transmission electron microscope (TEM) image includes a "sample image" and a "diffraction pattern of the sample". If the TEM image is a sample image, the crossover is a diffraction pattern of the sample. And if the TEM image is a diffraction pattern of a sample, the crossover is a sample image. Hereafter the TEM image is used in the following description based on the above definition.

The intermediate lens 5 is constituted of four stages of lenses, and is disposed between the objective lens 4 and the energy filter 100. By the four-stage intermediate lens 5, magnification, image rotation, image focus and crossover focus can be adjusted. The four stage-intermediate lens 5 forms an image of (focuses) a crossover on the entrance crossover plane S1 of the energy filter 100, and forms an image on the entrance image plane A1 (performs focusing).

In the case where a sample image is observed with the electron microscope 1 (sample image observation mode), the intermediate lens 5 focuses a diffraction pattern of the sample 9 on the entrance crossover plane S1 of the energy filter 100, and focuses an image of the sample 9 on the entrance image plane A1 of the energy filter 100. Further, in the case where a diffraction pattern of the sample 9 is observed with the electron microscope 1 (electron diffraction observation mode), the intermediate lens 5 focuses an image of the sample 9 on the entrance crossover plane S1 of the energy filter 100, and focuses a diffraction pattern of the sample 9 on the entrance image plane A1 of the energy filter 100.

The energy filter 100 is disposed between the intermediate lens 5 and the projection lens 6.

The energy filter 100 is an in-column energy filter (imaging energy filter). The trajectory of an electron passing through the energy filter 100 is a U-shape form. That is, the total deflection angle of the electron beam in the energy filter 100 is 180°.

The optical system of the energy filter 100 includes the entrance crossover plane S1, the entrance image plane A1, the energy dispersive plane (exit crossover plane) S2, and the achromatic plane (exit image plane) A2.

The crossover is focused on the entrance crossover plane S1 by the intermediate lens 5. The image is focused on the entrance image plane A1 by the intermediate lens 5. The energy filter 100 has a focusing function similar to an electron lens, and the entrance crossover plane S1 is projected onto the energy dispersive plane S2, and the entrance image plane A1 is projected onto the achromatic plane A2.

The energy dispersive plane S2 is a plane on which the energy dispersion is generated. The crossover is focused on the energy dispersive plane S2. The energy dispersive plane S2 is disposed mirror-symmetrically with the entrance crossover plane S1 with respect to the symmetry plane M.

No energy dispersion is generated on the achromatic plane A2. The image is formed on the achromatic plane A2. The achromatic plane A2 is disposed mirror-symmetrically with the entrance image plane A1 with respect to the symmetry plane M. An energy slit (not illustrated) is disposed in the energy dispersive plane S2. By selecting only electrons having a certain loss energy via the energy slit, a TEM image, corresponding to the loss energy, can be acquired (EF-TEM).

The energy filter 100 includes a first sector magnet 10, a second sector magnet 20, an entrance aperture 30, and an aberration corrector 40.

In the energy filter 100, the second sector magnet 20 is disposed behind (on the downstream side in the flowing direction of the electron beam) the first sector magnet 10. The first sector magnet 10 and the second sector magnet 20 generate deflecting magnetic fields respectively for deflecting the electron beam. The first sector magnet 10 and the second sector magnet 20 constitute an optical system for focusing the crossover and the image.

The first sector magnet 10 and the second sector magnet 20 are configured symmetrically with respect to the symmetry plane M. That is, the deflecting magnetic field generated by the first sector magnet 10 and the deflecting magnetic field generated by the second sector magnet 20 are symmetric with respect to the symmetry plane M.

The first sector magnet 10 and the second sector magnet 20 are curved. As illustrated in FIG. 1, the shape of the first sector magnet 10 is a sector of which center is the center $O_{10}$, and of which central angle is 90°. Similarly, as illustrated in FIG. 1, the shape of the second sector magnet 20 is a sector of which center is the center $O_{20}$, and of which central angle is 90°.

The traveling direction of the electron beam is rotated 90° by the first sector magnet 10. Similarly the traveling direction of the electron beam is rotated 90° by the second sector magnet 20. That is, the deflection angle of the electron beam in the first sector magnet 10 is 90°. Similarly the deflection angle of the electron beam in the second sector magnet 20 is 90°.

The sum of the deflection angle of the electron beam in the first sector magnet 10 and the deflection angle of the electron beam in the second sector magnet 20 is 180°. Therefore the electron beam which entered the energy filter 100 is inverted 180°, and is emitted. That is, the central trajectory (optical axis) of the electron beam that enters the energy filter 100 and the central trajectory (optical axis) of the electron beam that is emitted from the energy filter 100 are parallel with each other.

The polarity of the first sector magnet 10 and the polarity of the second sector magnet 20 are the same. Polarity here refers to the direction of the line of magnetic force of the deflecting magnetic field (direction of the magnetic field). That is, the direction of the line of magnetic force of the deflecting magnetic field generated by the first sector magnet 10 and the direction of the line of magnetic force of the deflecting magnetic field generated by the second sector magnet 20 are the same.

In the later mentioned example of FIG. 6, the direction of the line of magnetic force (direction of magnetic field) of the second sector magnet 20 is the Y direction, and the direction of the line of magnetic force here is in the +Y direction. The direction of the line of magnetic force of the first sector magnet 10 is also in the +Y direction, because the polarity of the first sector magnet 10 and the polarity of the second sector magnet 20 are the same. In the example illustrated in FIG. 6, an opposing pole piece surface 22 is an S pole, and an opposing pole piece surface 23 is an N pole.

The entrance aperture 30 is used for limiting the field of view at the entrance of the energy filter 100. The entrance aperture 30 is disposed on the entrance side of the first sector magnet 10. That is, the entrance aperture 30 is disposed between the entrance crossover S1 and the first sector magnet 10. It is preferable that the position of the entrance aperture 30 is close to the entrance of the first sector magnet 10.

Figure 2:
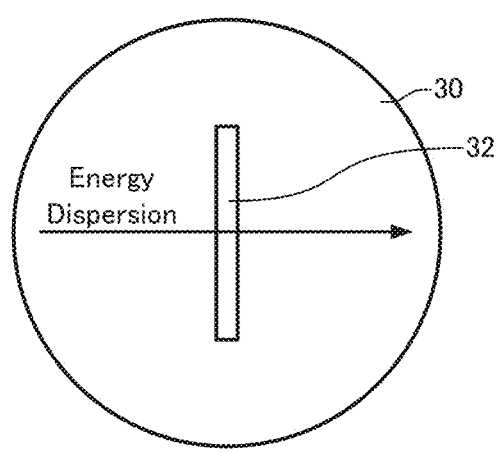
FIG. 2 is a diagram schematically illustrating an entrance aperture.

FIG. 2 is a diagram schematically illustrating the entrance aperture 30. FIG. 2 is a view of the entrance aperture 30 along the optical axis.

As illustrated in FIG. 2, a slit 32 is formed in the entrance aperture 30. A longitudinal direction of the slit 32 is perpendicular to the energy dispersion direction. In the slit 32, the ratio of the length in the longitudinal direction and the length in the lateral direction is 10:1, for example. The shape of the slit 32 is a rectangle having a longitudinal side which is perpendicular to the energy dispersion direction, for example. The entrance aperture 30 limits γ to 0.5 mrad, and limits δ to 5 mrad, for example.

The aberration corrector 40 is disposed on the symmetry plane M, as illustrated in FIG. 1. That is, the aberration corrector 40 is disposed between the first sector magnet 10 and the second sector magnet 20. The aberration corrector 40 includes a hexapole disposed on the symmetry plane M, and a quadrupole disposed on the symmetry plane M. That is, the aberration corrector 40 can generate both a hexapole field and a quadrupole field on the symmetry plane M.

By the entrance aperture 30 and the aberration corrector 40, the geometric aberration of the energy filter 100 is corrected, and energy resolution can be improved. The reason thereof will be described later.

The projection lens 6 is constituted of three stages of lenses that are disposed behind the energy filter 100 (on the downstream side in the flowing direction of the electron beam). The plane that is focused on the imaging apparatus 7 can be switched by adjusting the excitation of the three-stage projection lens 6. Thereby both the energy loss image and the energy spectrum can be acquired. In concrete terms, in order to observe the energy loss image, the achromatic plane A2 of the energy filter 100 is focused on the imaging apparatus 7 by the three-stage projection lens 6. In order to acquire the energy spectrum, the energy dispersive plane S2 of the energy filter 100 is focused on the imaging apparatus 7 by the three-stage projection lens 6.

A case where the three-stage projection lens 6 is disposed behind the energy filter 100 has been described, but the projection lens 6 may be constituted of two stages of lenses.

The imaging apparatus 7 captures an energy loss image, an energy spectrum, a TEM image or the like focused by the projection lens 6. The imaging apparatus 7 is a digital camera, such as a CCD camera or a CMOS camera, for example.

The electron microscope 1 has two barrels, 8a and 8b. The lens barrel 8a accommodates the electron source 2, the illumination lens 3, the objective lens 4 and the intermediate lens 5. The lens barrel 8b accommodates the projection lens 6. The lens barrel 8a and the lens barrel 8b are disposed in parallel on a pedestal (not illustrated). In the electron microscope 1, the energy filter 100 is disposed in the portion connecting the two lens barrels, 8a and 8b.

In the electron microscope 1, the electron beam emitted from the electron source 2 is focused by the illumination lens 3, and is irradiated onto the sample 9. The electron beam irradiated onto the sample 9 transmits through the sample 9, and is focused by the objective lens 4. Then the crossover is focused on the entrance crossover plane S1 by the intermediate lens 5, and the image is focused on the entrance image plane A1. In the energy filter 100, the crossover focused on the entrance crossover plane S1 is projected onto the energy dispersive plane S2, and the image focused on the entrance image plane A1 is projected onto the achromatic plane A2. An energy loss image can be observed when the achromatic plane A2 is focused on the imaging apparatus 7 using the projection lens 6. Furthermore, an energy spectrum can be acquired when the energy dispersive plane S2 is focused on the imaging apparatus 7 using the projection lens 6.

1.2 Energy Filter

Figure 3:
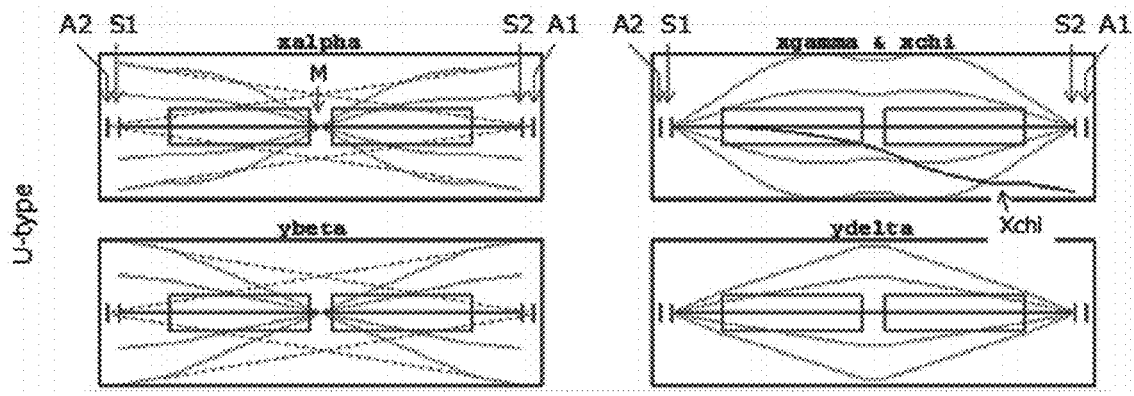
FIG. 3 is a diagram illustrating trajectories of an electron beam in the energy filter according to the first embodiment.
Figure 4:
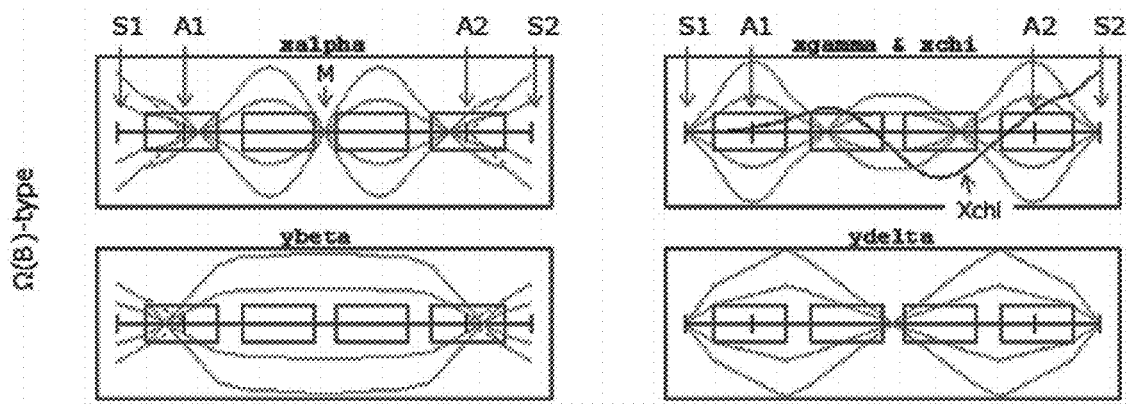
FIG. 4 is a diagram illustrating trajectories of an electron beam in an Ω filter (B-type).

The energy filter 100 will be described next in detail. FIG. 3 is a diagram illustrating the trajectories of the electron beam in the energy filter 100. FIG. 4 is a diagram of a comparative example, illustrating the trajectories of an electron beam in an Ω filter (B-type). Although a center axis (optical axis) of the energy filter is curved, the axis is drawn as a straight line in FIG. 3 and FIG. 4 for convenience.

FIG. 3 indicates four fundamental trajectories: xα, yβ, xγ and yδ of the electron beam in the energy filter 100. The trajectory xα and the trajectory yβ are trajectories passing through the center of the image plane. The trajectory xγ and the trajectory yδ are trajectories passing through the center of the crossover plane. xchi is a trajectory of the energy dispersed electron.

In the trajectory xγ in the energy filter 100 illustrated in FIG. 3, the crossover focused on the entrance crossover plane S1 by the intermediate lens 5 is focused on the energy dispersive plane S2. In the trajectory yδ, the crossover focused on the entrance crossover plane S1 by the intermediate lens 5 is focused on the energy dispersive plane S2 in the same way as the trajectory xγ.

That is, in the energy filter 100, the crossover is focused in the X direction once, excluding the initial focusing on the entrance crossover plane S1, and the crossover is focused in the Y direction once, excluding the initial focusing on the entrance crossover plane S1. Further, the focusing position of the crossover in the X direction and the focusing position of the crossover in the Y direction are on the energy dispersive plane S2, excluding the initial entrance crossover plane S1.

Furthermore, in the trajectory xα in the energy filter 100, the image focused on the entrance image plane A1 by the intermediate lens 5 is focused on the symmetry plane M and on the achromatic plane A2. In the trajectory yβ, the image focused on the entrance image plane A1 by the intermediate lens 5 is focused on the symmetry plane M and on the achromatic plane A2.

That is, in the energy filter 100, the image is focused in the X direction twice, excluding the initial focusing on the entrance image plane A1, and the image is focused in the Y direction twice, excluding the initial focusing on the entrance image plane A1. Further, the focusing position of the image in the X direction and the focusing position of the image in the Y direction are on the symmetry plane M and on the achromatic plane A2, excluding the initial entrance image plane A1. When the image is focused in the X direction and the Y direction, a real image is formed at the position of the symmetry plane M. The images focused on the entrance image plane A1 and the achromatic plane A2 are virtual images, and in the trajectories xα and yβ, the focal positions are positions where the straight line extending the electron trajectory, indicated by the broken line, intersects with the optical axis.

On the other hand, in the Ω filter (B-type) illustrated in FIG. 4, the crossover is focused in the X direction three times (see trajectory xγ). The focusing positions of the crossover in the X direction are the three intersections of the trajectory xγ with the optical axis of the filter. Further, in the Ω filter (B-type), the image is focused in the X direction twice (see trajectory xα). The focusing positions of the image in the X direction are on the symmetry plane M and the achromatic plane A2. The number of times of focusing of the crossover in the Y direction and the number of times of focusing of the image in the Y direction are one less than in the X direction respectively (see trajectories yδ and yβ).

In this way, in the Ω filter (B-type), the number of times of focusing of the crossover in the Y direction and the number of times of focusing of the image in the Y direction are one less than in the X direction respectively. Therefore in the Ω filter (B-type), the image is inverted. Furthermore, in the Ω filter (B-type), the number of times of focusing in the Y direction is decreased, so that an increase in the angle of the end surface of the pole piece (end surface angle) required for focusing is controlled, and the resultant aberrations are controlled.

On the other hand, in the energy filter 100, the number of times of focusing is the same in the X direction and the Y direction, as mentioned above, therefore an inversion of the image is not generated, unlike in the Ω filter (B-type).

The configuration of the second sector magnet 20 will be described next with reference to FIG. 5 to FIG. 7. Since the first sector magnet 10 and the second sector magnet 20 are designed to be symmetric, the first sector magnet 10 has a similar configuration as the second sector magnet 20.

Figure 5:
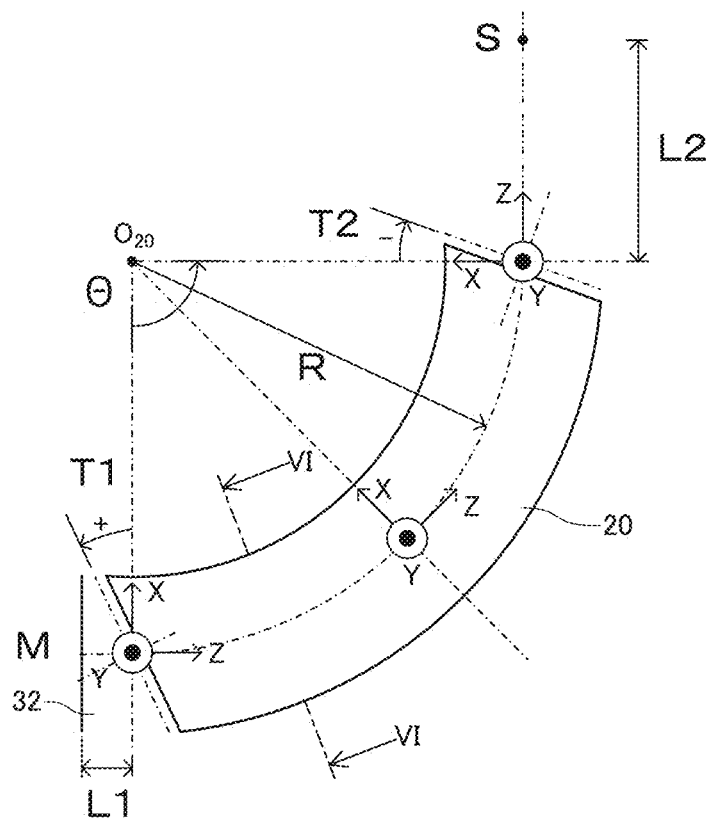
FIG. 5 is a diagram schematically illustrating a second sector magnet of the energy filter according to the first embodiment.
Figure 6:
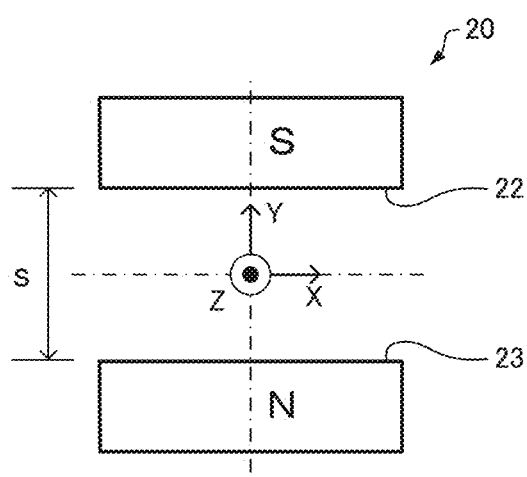
FIG. 6 is a diagram schematically illustrating the second sector magnet of the energy filter according to the first embodiment.
Figure 7:
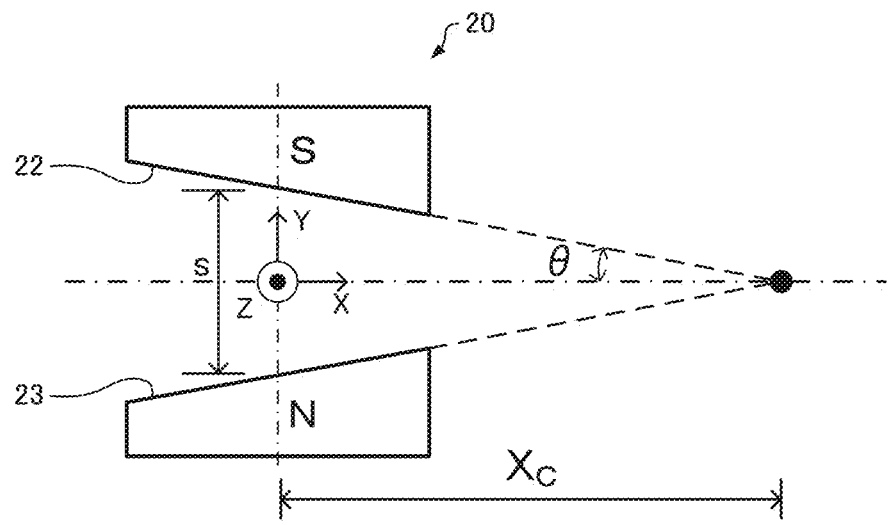
FIG. 7 is a diagram schematically illustrating the second sector magnet of the energy filter according to the first embodiment.

FIG. 5 to FIG. 7 are diagrams schematically illustrating the second sector magnet 20 of the energy filter 100. FIG. 6 is a cross-sectional view of the second sector magnet 20 illustrated in FIG. 5, taken along the VI-VI line. FIG. 7 illustrates a modification of the second sector magnet 20.

FIG. 6 illustrates a state in which the opposing pole piece surfaces 22 and 23 of the second sector magnet 20 (surfaces facing each other in the Y direction) are not tilted (tilt angle θ=0°). FIG. 7 illustrates a state in which the opposing pole piece surfaces 22 and 23 of the second sector magnet 20 are tilted (tilt angle θ ≠0°).

In FIG. 5 to FIG. 7, the X, Y and Z axes are indicated as three mutually orthogonal axes. It is assumed that the electrons travel in the Z direction, electrons are deflected by the deflecting magnetic field in the X direction, and the line of magnetic force in the deflecting magnetic field lies in the Y direction.

In order to focus the crossover and image in the X direction and Y direction respectively, four degrees of freedom are needed. Here the focus parameters (distance L1, distance L2, end surface angle T1 and end surface angle T2) are calculated when a distance L between the crossover plane S (energy dispersive plane S2) and the image plane (achromatic plane A2), or an equivalent distance L between the entrance crossover plane S1 and the entrance image plane A1 (see FIG. 1) is given. Since the energy filter 100 has a simple structure, there are no other focus parameters than these four parameters (distance L1, distance L2, end surface angle T1 and end surface angle T2). Therefore if the distance L is given, the distance L1, distance L2, end surface angle T1 and end surface angle T2 are determined uniquely. The tilt angle θ of the opposing pole piece surfaces 22 and 23 may be used as another focus parameter, but this aspect is not considered here.

The distance L1 is the distance between the symmetry plane M and the entrance of the second sector magnet 20. The distance L2 is the distance between the exit of the second sector magnet 20 and the crossover plane S (energy dispersive plane S2).

The end surface angle T1 is the angle of the end surface of the second sector magnet 20 on the entrance side. The end surface angle T2 is the angle of the end surface of the second sector magnet 20 on the exit side. The end surface angle T1 and the end surface angle T2 are defined such that the X axis is at 0° and a counterclockwise direction is a positive direction. The use of the end surface angles T1 and T2 can provide a focusing action in the Y direction. However if the end surface angles T1 and T2 are too large, aberrations tend to increase.

Figure 8:
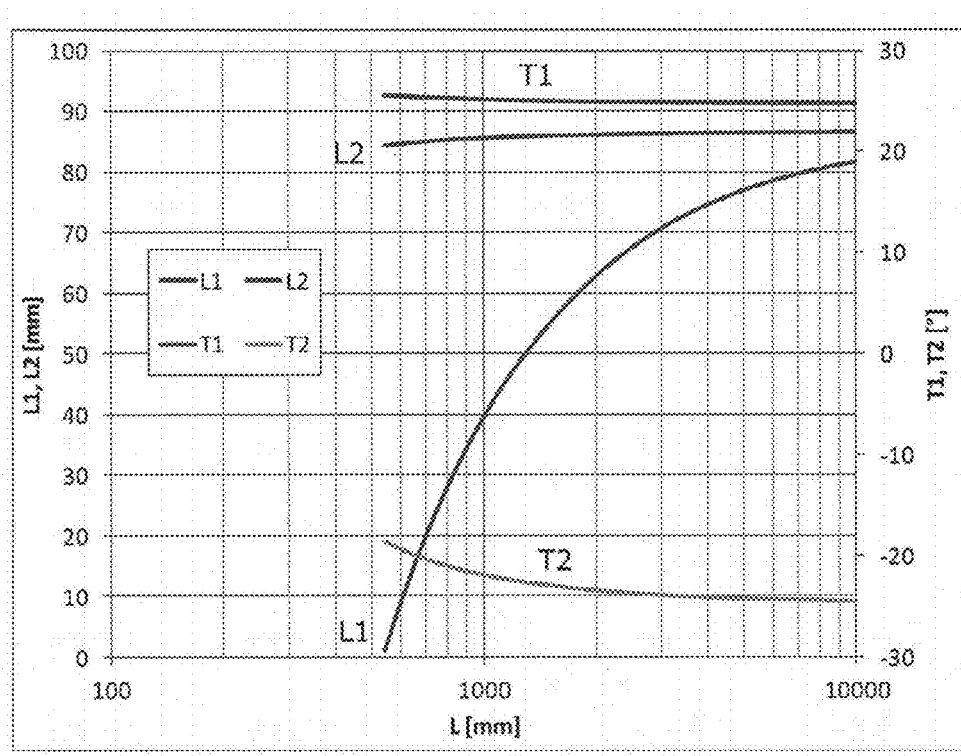
FIG. 8 is a graph illustrating a focus parameter with respect to a distance L.

FIG. 8 is a graph plotting the focus parameters (distance L1, distance L2, end surface angle T1 and end surface angle T2) with respect to the given distance L. The graph in FIG. 8 is a result of plotting the calculated values of the distance L1, distance L2, end surface angle T1 and end surface angle T2 with respect to the given distance L, based on the assumption that the deflection radius R=150 mm, the deflection angle Θ=90°, and the tilt angle θ=0°.

The deflection radius R is the radius of the central trajectory of the electron beam in the second sector magnet 20. The deflection angle Θ is the deflection angle of the electron beam in the second sector magnet 20. The tilt angle θ (see FIG. 7) is the tilt angle of the opposing pole piece surfaces 22 and 23 of the second sector magnet 20. Here the opposing pole piece surfaces 22 and 23 are parallel with each other, as illustrated in FIG. 6, since the tilt angle θ=0°.

As the graph in FIG. 8 indicates, in the case of the deflection radius R=150 mm, the deflection angle Θ=90° and the tilt angle θ=0°, the range of the distance L, in which the crossover and the image can be focused in the X direction and the Y direction in the energy filter 100, as illustrated in FIG. 3, is 538 mm or more. That is, the distance L can be set within the range of L>3.6 R (see Table 1).

Furthermore, as the graph in FIG. 8 indicates, in the case of the deflection radius R=150 mm, the deflection angle Θ=90° and the tilt angle θ=0°, the distance L2 is in the range from 80 mm to 90 mm, the end surface angle T1 is in the range from 24 to 26°, and the end surface angle T2 is in the range from −25° to −18°, and the distance L1 is longer than 0 mm and shorter than the distance L2.

As illustrated in FIG. 7, in the case where the opposing pole piece surfaces 22 and 23 of the second sector magnet 20 are titled (tilt angle θ ≠0°), or where a magnetic quadrupole is disposed in at least one of the entrance and the exit of the second sector magnet 20, the focusing action can be produced in the Y direction. Therefore the end surface angles T1 and T2 can be reduced. As a consequence, the end surface angles T1 and T2 are not limited to the above ranges.

The end surface angles T1 and T2 can be reduced to a minimum when the second sector magnet 20 produces the same focusing action at all times for both the X and Y directions, that is, when the round lens focus condition is met. At this time, the distance XC=2R is satisfied. That is, tan θ=s/4R is satisfied. The range of the deflection angle Θ is determined in theory, which is 2Θ<254° when only the magnetic field exists, and is 2Θ<180° when only the electric field exists. In the case of a round lens focus, the end surface angle T1=T2=0°. The range of the distance L, in which focusing is possible, is not limited to the above mentioned range (see Table 1).

Here, as illustrated in FIG. 7, which is a view in the Z direction, the distance XC is the distance between the position at which a plane including the opposing pole piece surface 22 and a plane including the opposing pole piece surface 23 intersect, and the central trajectory of the electron beam in the second sector magnet 20. The distance s is the distance between the opposing pole piece surface 22 and the opposing pole piece surface 23 in the YZ plane.

In the second sector magnet 20, the focusing action in the X direction and the focusing action in the Y direction may be different in intermediate positions if both match on the final focal plane. This is referred to as stigmatic focus.

The range of the distance L depends on the deflection angle Θ and the tilt angle θ of the opposing pole piece surfaces 22 and 23. In the case of 2Θ=90°, 2Θ=135°, 2Θ=180° and 2Θ=210°, the minimum value of the distance L, at which the crossover and the image can be focused in the X direction and Y direction, is given as indicated in the following Table 1. Here the deflection radius R=150 mm.

TABLE 1

| 2Θ | R/Xc = 0 Stigmatic focus | R/Xc = 1/2 Round lens focus |
|---|---|---|
| 90° | 478.4 mm (≈3.19 R) | 490.9 mm (≈3.27 R) |
| 135° | 415.0 mm (≈2.77 R) | 430.6 mm (≈2.87 R) |
| 180° | 538.4 mm (≈3.59 R) | 526.2 mm (≈3.51 R) |
| 210° | 1,018.0 mm (≈6.79 R) | 780.4 mm (≈5.20 R) |

As indicated in Table 1, in the case of the stigmatic focus (R/Xc=0), the range of the distance L at which focusing is possible is the distance L=478.4 mm or more (satisfies L>3.2 R) if 2Θ=90° and the tilt angle θ=0°. The range of the distance L at which focusing is possible is the distance L=415.0 mm or more (satisfies L>2.8 R) if 2Θ=135° and the tilt angle θ=0°. The range of the distance L at which focusing is possible is the distance L=538.4 mm or more (satisfies L>3.6 R) if 2Θ=180 and the tilt angle θ=0°. The range of the distance L at which focusing is possible is the distance L=1,018.0 mm or more (satisfies L>6.8 R) if 2Θ=210° and the tilt angle θ=0°.

In the case of the round lens focus (R/Xc=½), the range of the distance L at which focusing is possible is the distance L=490.9 mm or more (satisfies L>3.3 R) if 2Θ=900 and the tilt angle θ ≠0°. The range of the distance L at which focusing is possible is the distance L=430.6 mm or more (satisfies L>2.9 R) if 2Θ=1350 and the tilt angle θ≠0°. The range of the distance L at which focusing is possible is the distance L=526.2 mm or more (satisfies L>3.5 R) if 2Θ=180 and the tilt angle θ≠0°. The range of the distance L at which focusing is possible is the distance L=780.4 mm or more (satisfies L>5.2 R) if 2Θ=210° and the tilt angle θ≠0°.

The configuration of the second sector magnet 20 has been described above, but this content is also applicable to the first sector magnet 10, as mentioned above. That is, even in the first sector magnet 10, the distance L between the crossover plane S (entrance crossover plane S1) and the image plane A (entrance image plane A1) satisfies L>3.6 R, for example. In the first sector magnet 10, the distance L1 corresponds to the distance between the symmetry plane M and the exit of the first sector magnet 10. The distance L2 corresponds to the distance between the entrance of the first sector magnet 10 and the crossover plane S (entrance crossover plane S1). The end surface angle T1 corresponds to the angle of the end surface on the exit side of the first sector magnet 10. The end surface angle T2 corresponds to the angle of the end surface on the entrance side of the first sector magnet 10.

1.3 Entrance Aperture and Aberration Corrector

The principle of correcting the geometric aberrations of the energy spectrum using the entrance aperture 30 and the aberration corrector 40 will be described.

A method of improving the energy resolution by disposing the entrance aperture to limit γ and δ is known. For the entrance aperture, an aperture, in which a round hole is formed, is normally used.

In the case of using the entrance aperture to improve the energy resolution, the energy resolution improves as the size of the hole is reduced, but as the size of the hole is reduced, the spectral intensity decreases and the sensitivity of the energy filter decreases.

In order to improve the energy resolution without decreasing the sensitivity of the energy filter, aberration correction is required.

In the case of performing the aberration correction of the energy spectrum, a real image is formed on the symmetry plane M of the energy filter and a hexapole is disposed at this position, for example. However, this method is impractical because a hexapole can correct the spectrum only in one direction, which is insufficient to correct the aberrations. Furthermore, if the hexapole is disposed at a position other than the position of the symmetry plane M, a space, for mechanically disposing the hexapole, is required, therefore the design of the fundamental optical system is restricted.

Figure 9:
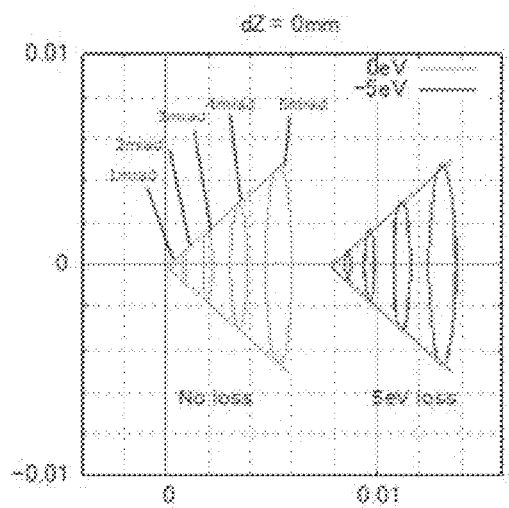
FIG. 9 is a graph illustrating the shapes of a spectrum in the case of using an entrance aperture in which a round hole is formed.

FIG. 9 is a graph of a reference example illustrating the shapes of a spectrum in the case of using an entrance aperture in which a round hole is formed. Here γ<5 mrad and δ<5 mrad.

The two triangular beams in FIG. 9 indicate an energy dispersion of a beam of an electron without energy loss (no loss), and an energy dispersion of a beam of an electron which lost energy (5 eV loss). The elliptical beam shape inside the triangle indicates the geometric aberration of the energy dispersive plane generated by plotting γδ estimating the image plane in the 1 mrad to 5 mrad range. The abscissa in FIG. 9 corresponds to the X axis, and the ordinate in FIG. 9 corresponds to the Y axis. The unit of length is mm. The X direction is the energy dispersion direction.

Figure 10:
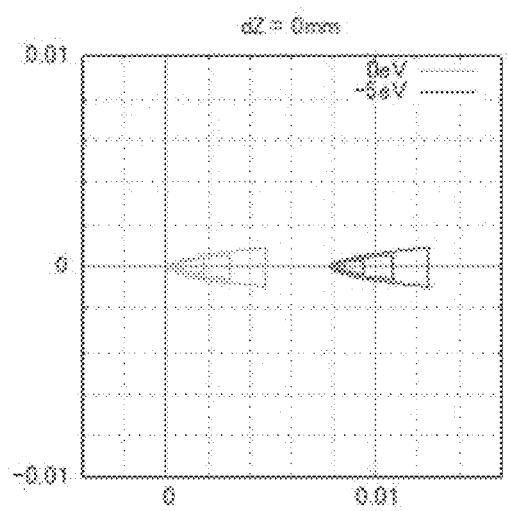
FIG. 10 is a graph illustrating the shapes of a spectrum in the case of using an entrance aperture in which a rectangular slit is formed.

FIG. 10 is a graph illustrating the shapes of the spectrum in the case of using the entrance aperture 30 in which a rectangular slit 32 is formed. Here γ<0.5 mrad and δ<5 mrad.

As indicated in FIG. 10, the beam size in the energy dispersion direction (X direction) in the case of using the entrance aperture 30 alone is not different from the case of using an entrance aperture having a round hole indicated in FIG. 9. Therefore the energy resolution does not improve.

Figure 11:
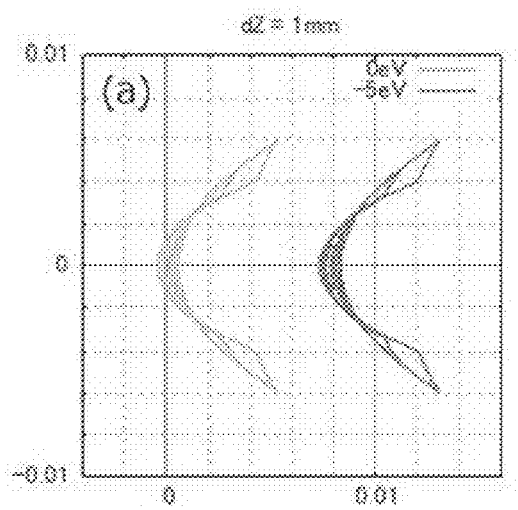
FIG. 11 is a graph illustrating the shapes of a spectrum in the case of using the entrance aperture in which the rectangular slit is formed, and defocusing from the energy dispersive plane.

FIG. 11 is a graph illustrating the shapes of a spectrum in the case of using the entrance aperture 30 in which the rectangular slit 32 is formed, and defocusing from the energy dispersive plane.

In the case of defocusing from the energy dispersive plane in the state of FIG. 10, the spectrum shapes becomes the shapes indicated in FIG. 11. In this case as well, the total beam size in the energy dispersion direction does not change. That is, the energy resolution does not improve, even after defocusing.

Figure 12:
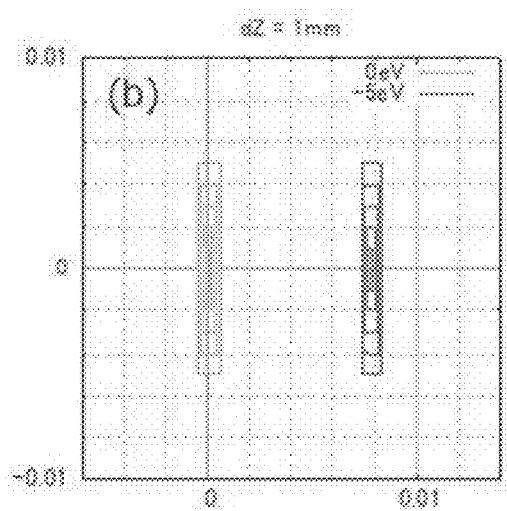
FIG. 12 is a graph illustrating the shapes of a spectrum in the case of using the entrance aperture in which the rectangular slit is formed, defocusing from the energy dispersive plane, and using a hexapole.
Figure 13:
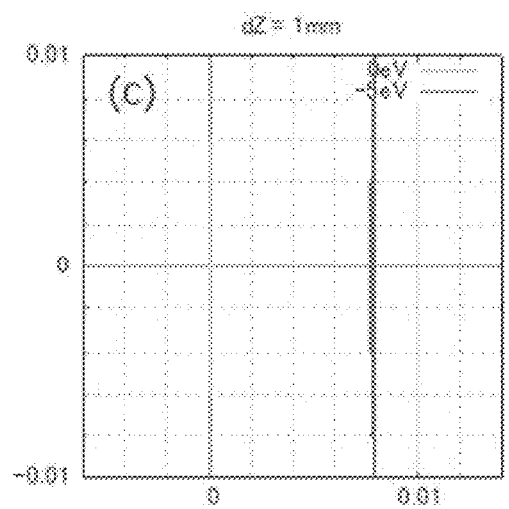
FIG. 13 is a graph illustrating the shapes of a spectrum in the case of using the entrance aperture in which the rectangular slit is formed, defocusing from the energy dispersive plane, and using a hexapole and a quadrupole.

FIG. 12 is a graph illustrating the shapes of a spectrum in the case of using the entrance aperture 30 in which a rectangular slit is formed, defocusing from the energy dispersive plane, and using a hexapole. FIG. 13 is a graph illustrating the shapes of a spectrum in the case of using the entrance aperture 30 in which a rectangular slit is formed, defocusing from the energy dispersive plane, and using a hexapole and quadrupole.

By using the hexapole disposed on the symmetry plane M of the energy filter 100 in the state in FIG. 11, the geometric aberrations of the spectrum are corrected, as indicated in FIG. 12.

Furthermore, by using the quadrupole disposed on the symmetry plane M, the focusing on the energy dispersive plane is changed, thereby the energy resolution can be improved, as indicated in FIG. 13.

Figure 14:
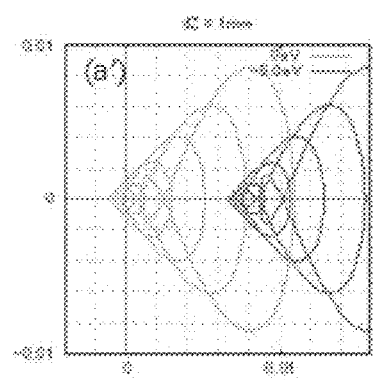
FIG. 14 is a graph illustrating the shapes of a spectrum in the case of using an entrance aperture in which a round hole is formed, and defocusing from the energy dispersive plane.
Figure 15:
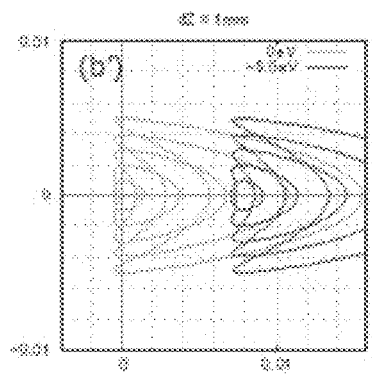
FIG. 15 is a graph illustrating the shapes of a spectrum in the case of using the entrance aperture in which a round hole is formed, defocusing from the energy dispersive plane, and using a hexapole.
Figure 16:
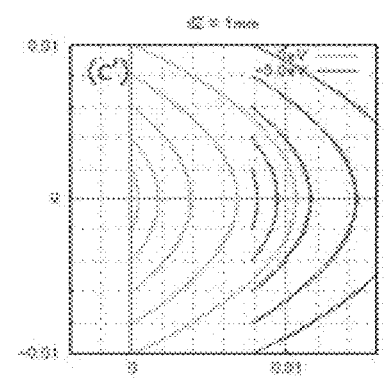
FIG. 16 is a graph illustrating the shapes of a spectrum in the case of using the entrance aperture in which a round hole is formed, defocusing from the energy dispersive plane, and using a hexapole and a quadrupole.

FIG. 14 is a graph illustrating the shapes of a spectrum in the case of using an entrance aperture in which a round hole is formed, and defocusing from the energy dispersive plane. FIG. 15 is a graph illustrating the shapes of a spectrum in the case of using the entrance aperture in which a round hole is formed, defocusing from the energy dispersive plane, and using an hexapole. FIG. 16 is a graph illustrating the shapes of a spectrum in the case of using the entrance aperture in which a round hole is formed, defocusing from the energy dispersive plane, and using the hexapole and quadrupole.

As indicated in FIG. 14 to FIG. 16, the energy resolution cannot be improved if the entrance aperture, in which a round hole is formed, is used, compared with the case of using the entrance aperture 30.

In this way, in the energy filter 100, the geometric aberrations of the energy spectrum can be corrected by the entrance aperture 30 and the aberration corrector 40. As a result, the energy resolution can be improved.

1.4 Features

The energy filter 100 has the following features.

The energy filter 100 is an energy filter that forms a real image on the symmetry plane M, and includes: the entrance aperture 30 provided with a slit having a longitudinal direction in a direction perpendicular to the energy dispersion direction, is formed; and an hexapole and a quadrupole disposed on the symmetry plane M. Therefore the energy filter 100 can correct the geometric aberrations of the energy spectrum with a simple structure, and can improve energy resolution. Furthermore, by disposing the hexapole and the quadrupole on the symmetry plane M where a real image is formed, the aberrations of the energy spectrum can be corrected without affecting the image.

In the energy filter 100, a number of times of focusing of the crossover in the X direction and in the Y direction are once respectively, excluding the initial focusing of the entrance crossover plane S, and the image forming position of the crossover in the X direction and in the Y direction are on the energy dispersive plane S2, excluding the initial entrance crossover plane S. A number of times of focusing of the image in the X direction and in the Y direction are twice respectively, excluding the initial focusing of the entrance image plane A1, and the focusing position of the image in the X direction and in the Y direction are on the symmetry plane M and the achromatic plane A2, excluding the initial entrance image plane A1. Therefore according to the energy filter 100, the structure can be simplified, and low aberration can be implemented.

In the energy filter 100, the first sector magnet 10 and the second sector magnet 20 are configured to be mirror-symmetric with respect to the symmetry plane M. Therefore in the energy filter 100, some aberrations (e.g. part of second-order geometric aberrations) can be cancelled out.

In the energy filter 100, in the case where the radius of the central trajectory of the electron beam in the second sector magnet 20 is R, the deflection angle Θ is 90°, and the tilt angle θ is 0°, the distance L between the energy dispersive plane S2 and the achromatic plane A2 satisfies L>3.6 R. Similarly in the case where the radius of the central trajectory of the electron beam in the first sector magnet 10 is R, the distance L between the entrance crossover plane S1 and the entrance image plane A1 satisfies L>3.6 R. That is, the sum of the deflection angle of the electron beam in the first sector magnet 10 and the deflection angle of the electron beam in the second sector magnet 20 is 180°, and the distance L satisfies L>3.6 R. Therefore according to the energy filter 100, the structure can be simplified, and low aberration can be implemented.

In the energy filter 100, in the case where the radius of the central trajectory of the electron beam in the second sector magnet 20 is R, the deflection angle Θ is 45°, and the tilt angle θ is 0°, the distance L between the energy dispersive plane S2 and the achromatic plane A2 satisfies L>3.2 R. Similarly in the case where the radius of the central trajectory of the electron beam in the first sector magnet 10 is R, the distance L between the entrance crossover plane S1 and the entrance image plane A1 satisfies L>3.2 R. That is, the sum of the deflection angle of the electron beam in the first sector magnet 10 and the deflection angle of the electron beam in the second sector magnet 20 is 90°, and the distance L satisfies L>3.2 R. Therefore according to the energy filter 100, the structure can be simplified, and low aberration can be implemented.

In the energy filter 100, the sum of the deflection angle of the electron beam in the first sector magnet 10 and the deflection angle of the electron beam in the second sector magnet 20 is 180°. Therefore as illustrated in FIG. 1, the energy filter 100 can be disposed in a portion connecting the two lens barrels 8a and 8b in the electron microscope 1, and an increase in the height of the electron microscope (lens barrels) can be controlled.

The electron microscope 1 can implement a low cost and high performance electron microscope since the energy filter 100, which can have a simple structure and implement low aberration, is included. Further, the axis adjustment of the electron microscope 1 easy, since the energy filter 100 has low aberration.

In the electron microscope 1, the energy filter 100 is disposed between the intermediate lens 5 and the projection lens 6. Therefore in the electron microscope 1, some aberrations generated from the energy filter itself, due to the symmetric structure of the energy filter, can be cancelled out, hence these aberrations need not be corrected. Furthermore, in the electron microscope 1, the image observation mode and the spectrum observation mode can be easily switched by the projection lens 6. In addition, in the electron microscope 1, filtering is performed by the energy filter prior to magnification by the projection lens, therefore observation in a wide field of view, from low to high magnification, can be supported.

2. Second Embodiment

Figure 17:
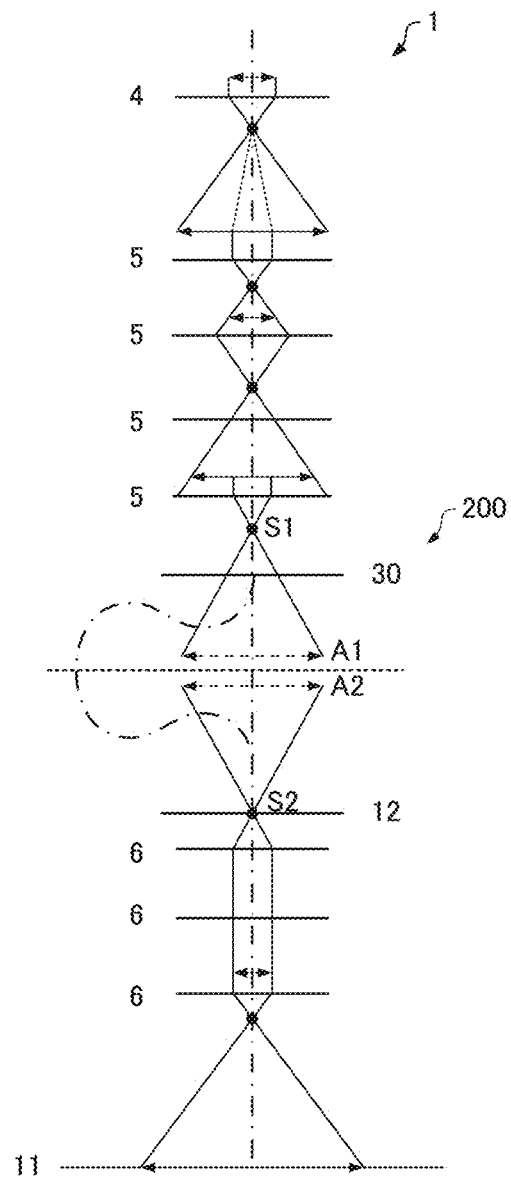
FIG. 17 is a diagram illustrating an example of an energy filter according to the second embodiment, and optical systems disposed in front and rear of the energy filter.
Figure 18:
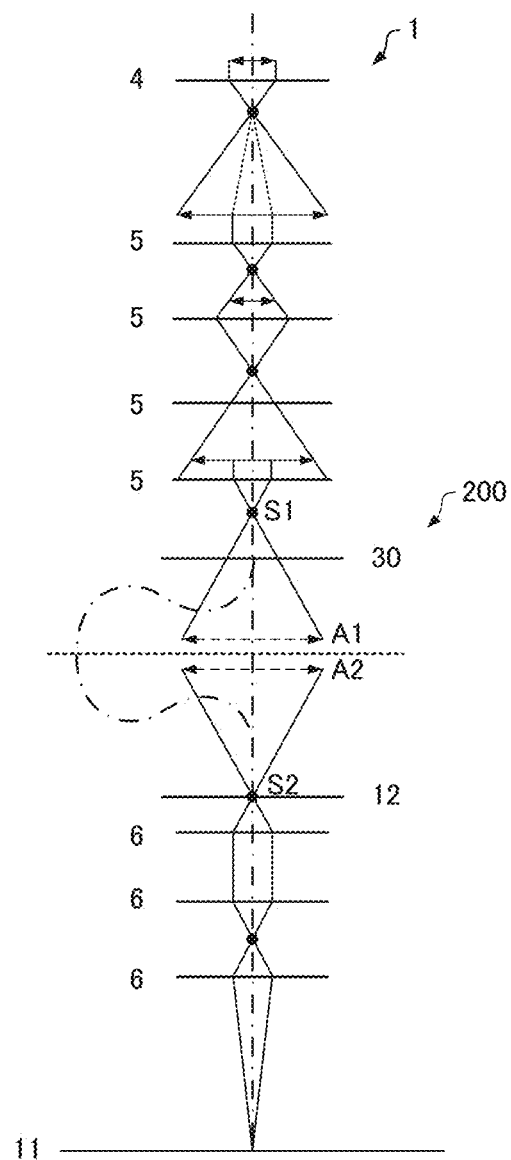
FIG. 18 is a diagram illustrating an example of the energy filter according to the second embodiment, and optical systems disposed in front and rear the energy filter.

An energy filter according to the second embodiment will be described with reference to the drawings. FIG. 17 and FIG. 18 are diagrams illustrating an example of an energy filter 200 according to the second embodiment, and optical systems disposed in front and rear of the energy filter. FIG. 17 illustrates the state where the achromatic plane A2 is focused on the screen 11, and FIG. 18 illustrates the state where the energy dispersive plane S2 is focused on the screen 11. In FIG. 17 and FIG. 18, only the imaging system of the electron microscope 1 is illustrated for convenience.

In the following description on the electronic microscope 1 equipped with the energy filter 200 of the second embodiment, a component part having the same function as the component part of the electron microscope 1 of the first embodiment is denoted with the same reference sign, and detailed description thereof will be omitted.

The energy filter 200 according to the second embodiment is an A-type omega energy filter (Ω filter).

An intermediate lens 5 constituted of four stages is disposed between the energy filter 200 and the objective lens 4. The four-stage intermediate lens 5 is adjusted so as to form an image (focuses) of a crossover on the entrance crossover plane S, and form an image on the entrance image plane A1 (performs focusing).

A projection lens 6, constituted of three stages, is disposed behind the energy filter 200. A plane of which image is formed on the screen 11 is switched by adjusting the excitation of the three-stage projection lens 6, whereby an energy loss image and an energy spectrum can be acquired. In concrete terms, in order to observe the energy loss image, the achromatic plane A2 is focused on the screen 11 by the three-stage projection lens 6, as illustrated in FIG. 17. In order to acquire the energy spectrum, the energy dispersive plane S2 is focused on the screen 11 by the three-stage projection lens 6, as illustrated in FIG. 18.

An energy slit 12 is used to select only electrons having a certain loss energy. By selecting only electrons which have a certain loss energy using the energy slit 12, a TEM image corresponding to the loss energy can be acquired (EF-TEM).

An entrance aperture 30 is used to limit the field of view that enters the energy filter 200. By using the entrance aperture 30 to control the field of view that enters the energy filter 200, a spectrum, which is less affected by aberrations, can be acquired.

Figure 19:
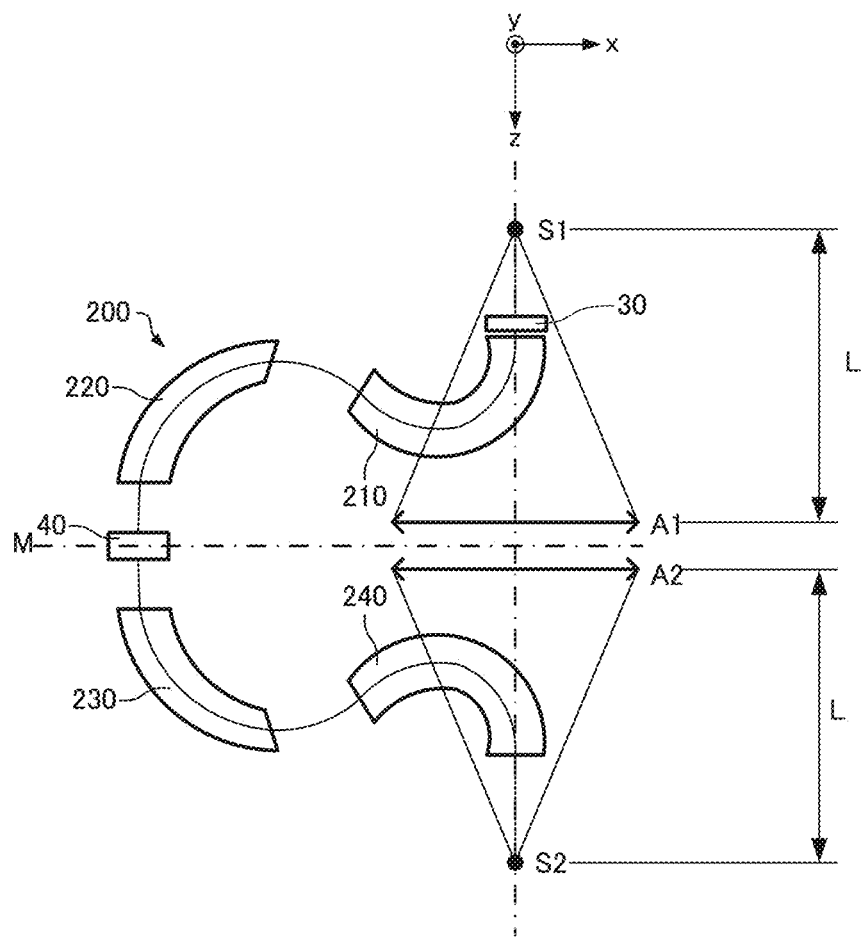
FIG. 19 is a diagram illustrating the energy filter according to the second embodiment.

FIG. 19 is a diagram illustrating the configuration of the energy filter 200. In FIG. 19, the X, Y and Z axes are indicated as three mutually orthogonal axes. It is assumed that the electrons travel in the Z direction, electrons are deflected by the deflecting magnetic field in the X direction, and the line of magnetic force in the deflecting magnetic field lies in the Y direction.

As illustrated in FIG. 19, the energy filter 200 includes: a first sector magnet 210, a second sector magnet 220, a third sector magnet 230, a fourth sector magnet 240, an entrance aperture 30 and an aberration corrector 40.

The first sector magnet 210, the second sector magnet 220, the third sector magnet 230 and the fourth sector magnet 240 are disposed in this order from the entrance side of the energy filter 200. The first sector magnet 210 and the fourth sector magnet 240 are disposed symmetrically with respect to the symmetry plane M. The second sector magnet 220 and the third sector magnet 230 are disposed symmetrically with respect to the symmetry plane M.

The entrance aperture 30 is disposed between the first crossover plane S1 and the first sector magnet 210. In the entrance aperture 30, a slit 32 having a longitudinal direction in a direction perpendicular to the energy dispersion direction (see FIG. 2), is disposed.

The aberration corrector 40 is disposed on the symmetry plane M. The aberration corrector 40 is disposed between the second sector magnet 220 and the third sector magnet 230. The aberration corrector 40 includes a hexapole and a quadrupole.

Figure 20:
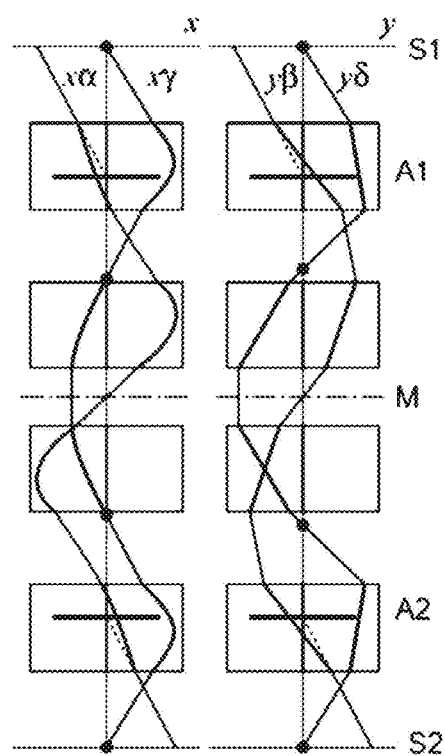
FIG. 20 is a diagram illustrating trajectories of an electron beam in the energy filter according to the second embodiment.
Figure 21:
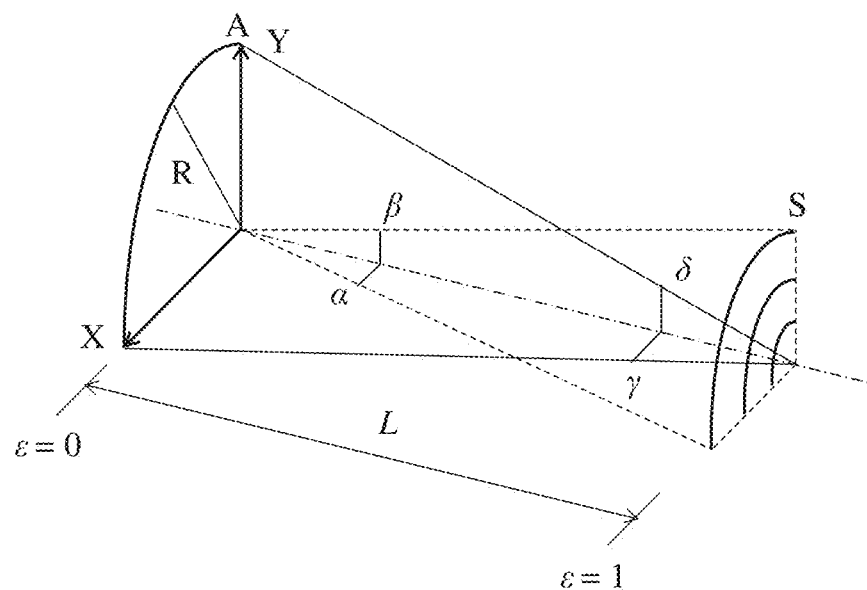
FIG. 21 is a diagram illustrating a relationship between an achromatic plane of the energy filter and the energy dispersive plane.
Figure 22:
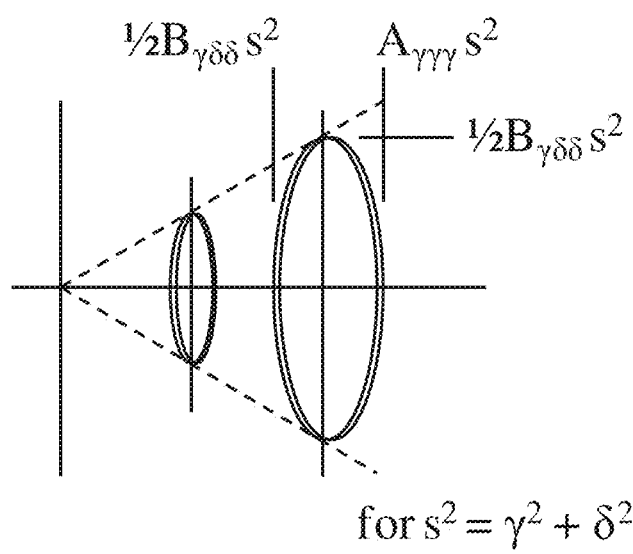
FIG. 22 is a diagram illustrating a geometric aberration generated on the energy dispersive plane.

FIG. 20 is a diagram illustrating trajectories of an electron beam in the energy filter 200. In FIG. 20, four fundamental trajectories of the energy filter, xα, yβ, xγ and yδ, are illustrated. Although the center axis (optical axis) of the energy filter is curved, the optical axis is drawn as a straight line for convenience in FIG. 20. In FIG. 20, the sector magnet is indicated by a square region.

The energy filter 200 is an A-type Ω filter. The xγ ray intersects with the optical axis at three points, excluding the entrance crossover plane S. That is, a number of times of focusing of the crossover in the X direction is three, excluding the initial focusing of the entrance crossover plane. A number of times of focusing of the crossover in the Y direction is the same as the number of times of focusing the crossover in the X direction.

The xα ray intersects with the optical axis at two points (M and A2), excluding the entrance image plane A1. That is, a number of times of focusing of the image in the X direction is twice, excluding the initial focusing of the entrance image plane A1. A number of times of focusing of the image in the Y direction is the same as the number of times of focusing of the image in the X direction.

In the case of the A-type Ω filter, a real image is formed on the symmetry plane M. Therefore similar to the energy filter 100, the geometric aberration of the energy spectrum can be corrected by the entrance aperture 30 and the aberration corrector 40.

The invention is not limited to the above embodiments, but can be modified in various ways within the scope of the essence of the invention.

For example, in the first embodiment, the energy filter in the case where the trajectory of electrons is U-shaped was described, and in the second embodiment, the Ω filter in the case where the trajectory of electrons is an Ω type was described, but the invention can also be applied to other energy filters with which a real image is formed on the symmetry plane M.

For another example, in the first embodiment, the case where the sum of the deflection angles of the electron beams is 1800 was described, but the sum of the deflection angles of the electron beams is not limited to this, and may be 90°, 135°, 210° or the like, for example.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An energy filter that has a plurality of sector magnets which are configured symmetrically with respect to a symmetry plane, and forms a real image on the symmetry plane, the energy filter comprising:
    an entrance aperture provided with a slit having a longitudinal direction in a direction perpendicular to an energy dispersion direction;
    a hexapole and a quadrupole disposed on the symmetry plane; and
    a first sector magnet and a second sector magnet that generate a deflecting magnetic field that deflects a charged particle beam, wherein
    the first sector magnet and the second sector magnet are configured mirror-symmetrically with respect to the symmetry plane,
    the polarity of the first sector magnet and the polarity of the second sector magnet are identical,
    the first sector magnet and the second sector magnet constitute an optical system for focusing a crossover and an image,
    when the charged particle beam travels in a Z direction, the charged particle beam is deflected by the deflecting magnetic field in an X direction, and a direction of a line of magnetic force in the deflecting magnetic field is a Y direction,
    the number of times of focusing of the crossover in the X direction and the number of times of focusing of the crossover in the Y direction are both once, excluding an initial focusing on an entrance crossover plane,
    a focusing position of the crossover in the X direction and a focusing position of the crossover in the Y direction are an energy dispersive plane, excluding an initial entrance crossover plane,
    the number of times of focusing of the image in the X direction and the number of times of the focusing of the image in the Y direction are twice, excluding an initial focusing on an entrance image plane,
    a focusing position of the image in the X direction and a focusing position of the image in the Y direction are the symmetry plane and an achromatic plane, excluding an initial entrance image plane,
    a real image is formed at the position of the symmetry plane when the image is focused in the X direction and in the Y direction,
    the entrance crossover plane and the energy dispersive plane are positioned mirror-symmetrically with respect to the symmetry plane, and
    the entrance image plane and the achromatic plane are positioned mirror-symmetrically with respect to the symmetry plane.

2. The energy filter according to claim 1, wherein
    the entrance aperture is disposed between the initial entrance crossover plane and the first sector magnet, and
    the hexapole and the quadrupole are disposed between the first sector magnet and the second sector magnet.

3. An energy filter that has a plurality of sector magnets which are configured symmetrically with respect to a symmetry plane, and forms a real image on the symmetry plane, the energy filter comprising:
    an entrance aperture provided with a slit having a longitudinal direction in a direction perpendicular to an energy dispersion direction; and
    a hexapole and a quadrupole disposed on the symmetry plane,
    wherein the energy filter is an omega type,
    when the charged particle beam travels in a Z direction, the charged particle beam is deflected by the deflecting magnetic field in an X direction, and a direction of a line of magnetic force in a deflecting magnetic field is a Y direction,
    the number of times of focusing of a crossover in the X direction is three, excluding an initial focusing on an entrance crossover plane,
    the number of times of focusing of an image in the X direction is twice, excluding an initial focusing on an entrance image plane,
    the number of times of focusing of the crossover in the Y direction is the same as the number of times of focusing of the crossover in the X direction, and
    the number of times of focusing of the image in the Y direction is the same as the number of times of focusing of the image in the X direction.

4. The energy filter according to claim 3, further comprising:
    a first sector magnet, a second sector magnet, a third sector magnet and a fourth sector magnet,
    wherein the first sector magnet, the second sector magnet, the third sector magnet and the fourth sector magnet are disposed in this order from an entrance side,
    the first sector magnet and the fourth sector magnet are disposed symmetrically with respect to the symmetry plane, the second sector magnet and the third sector magnet are disposed symmetrically with respect to the symmetry plane, the entrance aperture is disposed between an initial entrance crossover plane and the first sector magnet, and the hexapole and the quadrupole are disposed between the second sector magnet and the third sector magnet.

5. A charged particle beam apparatus comprising the energy filter according to claim 1.

6. A charged particle beam apparatus comprising the energy filter according to claim 3.

* * * * *